(12) United States Patent
Bijnen et al.

(10) Patent No.: US 8,169,593 B2
(45) Date of Patent: May 1, 2012

(54) LITHOGRAPHIC APPARATUS AND DEVICE MANUFACTURING METHOD

(75) Inventors: Franciscus Godefridus Casper Bijnen, Valkenswaard (NL); Joannes Theodoor De Smit, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 651 days.

(21) Appl. No.: 12/261,663

(22) Filed: Oct. 30, 2008

(65) Prior Publication Data
US 2009/0051891 A1 Feb. 26, 2009

Related U.S. Application Data

(62) Division of application No. 11/020,561, filed on Dec. 27, 2004, now Pat. No. 7,459,247.

(51) Int. Cl.
*G03B 27/42* (2006.01)
*G03B 27/68* (2006.01)
*G03B 27/54* (2006.01)
*G01B 11/00* (2006.01)

(52) U.S. Cl. ............ 355/53; 355/52; 355/67; 356/401

(58) Field of Classification Search ............ 355/52, 355/53, 55, 67–71, 72–74; 430/8, 22, 30, 430/311; 250/492.1, 492.2, 492.22, 493.1, 250/548; 356/139, 399–401
See application file for complete search history.

(56) References Cited

U.S. PATENT DOCUMENTS 4,578,590 A * 3/1986 Wu .............................. 250/548
4,629,313 A * 12/1986 Tanimoto ...................... 355/53
4,657,379 A * 4/1987 Suwa ............................ 355/53
(Continued)

FOREIGN PATENT DOCUMENTS
JP 2001-500628 A 1/2001
(Continued)

OTHER PUBLICATIONS

English Translation of Office Action for Japanese Patent Application No. 2005-372597 mailed Dec. 2, 2008, 4 pgs.
(Continued)

*Primary Examiner* — Peter B Kim
*Assistant Examiner* — Christina Riddle
(74) *Attorney, Agent, or Firm* — Sterne, Kessler, Goldstein & Fox P.L.L.C

(57) ABSTRACT

A system and method use a substrate with a pattern of individual, indiscrete alignment marks, i.e., the marks are separate and distinct from each other, and each mark is not divided into component parts. The pattern of marks is distributed over an area of the substrate, and the method also comprises the steps of providing a beam of radiation using an illumination system and an array of individually controllable elements to impart the beam with a pattern in its cross-section, providing a projection system to project the patterned beam onto the substrate, and providing a movement system to effect relative movement between the substrate and the projection system. A detection system, able to detect the alignment marks individually, is also provided, and the method includes using the detection system to detect the marks to determine a relative position of the substrate to the projection system, using the movement system to position the substrate relative to the projection system, and using the projection system to project the patterned beam of radiation onto a target portion of the substrate. The pattern comprises one or more rows of simple alignment marks, such as spots and short linear marks.

10 Claims, 4 Drawing Sheets

U.S. PATENT DOCUMENTS

| | | | |
|---|---|---|---|
| 5,132,195 A * | 7/1992 | Pool | 430/22 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A * | 6/1996 | Nelson | 430/311 |
| 5,530,482 A | 6/1996 | Gove et al. | |
| 5,579,147 A | 11/1996 | Mori et al. | |
| 5,596,413 A * | 1/1997 | Stanton et al. | 356/401 |
| 5,677,703 A | 10/1997 | Bhuva et al. | |
| 5,777,722 A * | 7/1998 | Miyazaki et al. | 355/53 |
| 5,808,797 A | 9/1998 | Bloom et al. | |
| 5,982,553 A | 11/1999 | Bloom et al. | |
| 6,132,910 A * | 10/2000 | Kojima | 430/22 |
| 6,133,986 A * | 10/2000 | Johnson | 355/67 |
| 6,177,980 B1 | 1/2001 | Johnson | |
| 6,379,867 B1 * | 4/2002 | Mei et al. | 430/296 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,949,755 B2 | 9/2005 | Tanaka | |
| 6,967,711 B2 * | 11/2005 | Gui | 355/67 |
| 7,297,969 B1 * | 11/2007 | Wolinsky et al. | 250/548 |
| 7,459,247 B2 | 12/2008 | Bijnen et al. | |
| 2004/0041104 A1 | 3/2004 | Liebregts et al. | |
| 2004/0130561 A1 | 7/2004 | Jain | |
| 2004/0157142 A1 * | 8/2004 | Smith et al. | 430/22 |
| 2005/0007572 A1 | 1/2005 | George et al. | |
| 2006/0061743 A1 * | 3/2006 | Den Boef et al. | 355/53 |
| 2006/0092419 A1 * | 5/2006 | Gui | 356/401 |
| 2006/0132735 A1 * | 6/2006 | Lof et al. | 355/53 |
| 2007/0236695 A1 * | 10/2007 | Sjostrom | 356/401 |

FOREIGN PATENT DOCUMENTS

| | | |
|---|---|---|
| JP | 2001-274058 A | 10/2001 |
| JP | 2004-006527 A | 1/2004 |
| JP | 2004-233608 A | 8/2004 |
| JP | 2004-272167 A | 9/2004 |
| WO | WO 97/34171 A2 | 9/1997 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Notification of Reasons for Refusal for Japanese Patent Application No. 2005-372597 mailed Aug. 18, 2009, 9 pgs.

* cited by examiner

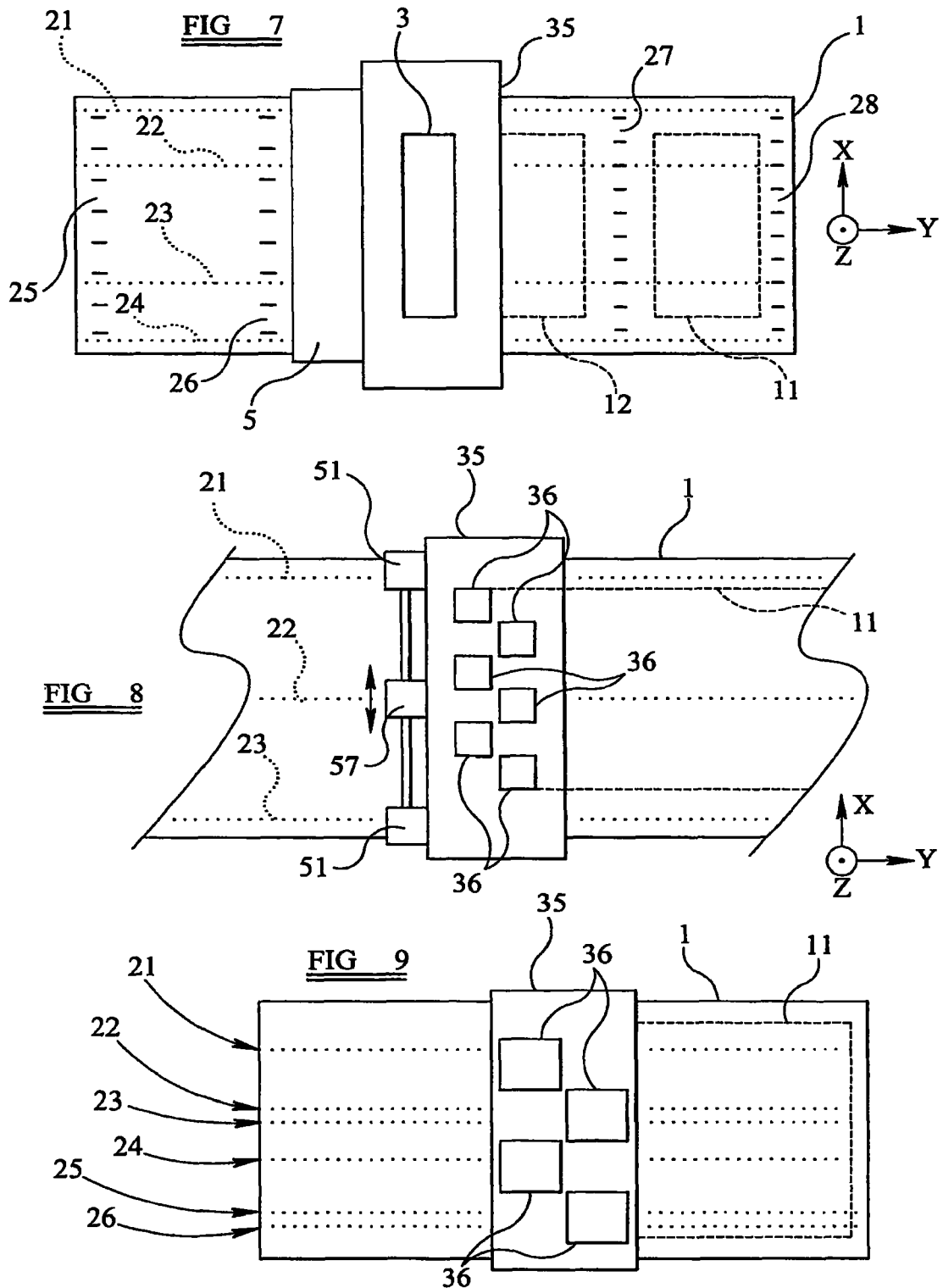

LITHOGRAPHIC APPARATUS AND DEVICE MANUFACTURING METHOD

CROSS REFERENCE TO RELATED APPLICATIONS

The present application is a divisional of U.S. application Ser. No. 11/020,561, filed on Dec. 27, 2004, now U.S. Pat. No, 7,459,247, incorporated herein in its entirety by reference.

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern. This latter approach is referred to as maskless lithography.

In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the beam in a given direction (the "scanning" direction), while synchronously scanning the substrate parallel or anti-parallel to this direction.

It will be appreciated that, whether or not a lithographic apparatus operates in stepping or scanning mode, it is vital that the patterned beam is directed onto the appropriate target portion of the substrate surface. In many circumstances, multi-layer structures are built up on the surface of the substrate as a result of a sequence of lithographic processing steps, and it is of course vital that the successive layers formed in the substrate are correctly aligned with each other. Thus, great care must be taken to ensure that the position of the substrate relative to the beam projection system is accurately known. In the past, with mask-based lithographic systems, this has generally been achieved by positioning the substrate in a known orientation on a substrate table, for example by engaging an edge of the substrate with a support surface on the substrate table, and then using a reference mark on the substrate to identify exactly where the substrate is relative to the substrate table. A metrology system is then used to control relative displacement between the substrate and the beam projection system, the reference mark establishing a datum position relative to which all displacements are measured. The reference mark has typically comprised a grating, and has been detected by observing its diffraction effects on an incident beam of the appropriate wavelength. These effects are thus a result of interaction between the incident beam and all of the elements of grating.

As the size of substrates increases it becomes more difficult to rely upon a single reference mark on a substrate to determine exactly where the substrate is relative to a datum position.

Establishing substrate position with sufficient accuracy is a particular problem in the manufacture of large devices, such as large flat panel displays (FPD's) relying upon large numbers of liquid crystal devices (LCD's) or other devices providing controllable pixels. In the case of FPD's, very large thin glass substrates are contemplated, e.g. about 1.85×2.2 meters with a thickness of less than about 1 mm. On each glass substrate, one or more panels can be defined, each panel corresponding to a single product, such as a computer monitor screen or a television (T.V.) screen with sizes ranging currently from 10 inches to 55 inches (measured diagonally from corner to corner). Within each panel area on a single substrate, LCD's each defining individual pixels are arrayed. To ensure high optical transmission efficiency and to avoid irregular visually apparent optical effects, no alignment gratings can be formed within any one panel. This is because the gratings would result in observable defects in the image on the eventual completed device.

One source of positional errors between the projection system and the substrate is thermal expansion. Even if an alignment mark is positioned in precisely the same location with respect to a beam projection system in two separate exposure steps, a structure formed on the surface of a substrate in the first step will not register with a subsequently formed structure in the second step if the temperature of the substrate has changed. This is a well known problem that has been addressed in the past by taking great care to maintain substrates at a predetermined datum temperature. However, this is difficult to achieve, particularly with large substrates. It is now possible to contemplate substrates of very large size, for example substrates having outside dimensions of the order of about two meters. Very small temperature variations across substrates of such size can result in expansions and contractions that are significant in the context of, for example, LCD display panels.

Therefore, what is needed is a system and method that allows for compensating for temperature effects during manufacturing of a substrate.

SUMMARY

According to an embodiment of the present invention, there is provided a device manufacturing method comprising the following steps. Providing a substrate with a pattern of individual, indiscrete alignment marks (i.e., marks that are not divided into distinct parts and have no sub-structure), the alignment marks being distributed over an area of the substrate. Providing a beam of radiation using an illumination system. Using an array of individually controllable elements to impart the beam with a pattern in its cross-section. Providing a projection system to project the patterned beam onto the substrate. Providing a movement system to effect relative movement between the substrate and the projection system. Providing a detection system able to detect the alignment marks individually (e.g., it does not rely on detecting the results of an interaction between a radiation beam and a plurality of marks). Using the detection system to detect the alignment marks to determine a relative position of the substrate to the projection system. Using the movement system to position the substrate relative to the projection system. Using the projection system to project the patterned beam of radiation onto a target portion of the substrate.

In one example, by using alignment marks (hereinafter, also referred to as "marks") and a detection system able to detect them individually, very small marks can be used and distributed over wide areas of even the largest substrates to enable accurate positional information to be obtained during the patterning process. Marks can be used that are small enough to be located inside the panel areas of flat panel displays, for example, without those marks being noticeable in the finished device. The marks can be widely and frequently distributed, at known locations, and this enables even localized thermal expansions to be compensated for (e.g., by appropriate adjustment of the data being supplied to the patterning device or devices and/or substrate movement control). The requirements on substrate conditioning can thus be less stringent.

A variety of forms of alignment marks can be employed in embodiments of the invention. For example, at least some of the alignment marks can be circular, spots, dots, or linear.

In one example, the projection system is arranged such that the radiation pattern projected onto the substrate comprises a plurality of spots having a common size, and at least some of the alignment marks are spots having substantially the same the size. This size can be the field size of a lens in a micro lens array (MLA) used to project the radiation pattern.

In one example, the alignment marks are arranged to have substantially different reflective characteristics from the substrate.

In certain embodiments, the pattern of alignment marks comprises at least one row of alignment marks (i.e., a linear arrangement). The row can be arranged to extend along a length of the substrate (e.g., in a scan direction), or across a width (e.g., perpendicular to a scan direction).

In one example, the method can comprise the step of projecting the patterned beam onto one or more target portions to deliver a radiation dose pattern over a target area of the substrate. The row can be arranged outside that target area, for example adjacent to it and/or adjacent an edge of the substrate. Alternatively, the row can be arranged inside the target area.

In one example, the pattern of alignment marks can include a combination of marks, some inside areas to be patterned, and some on portions of the substrate on which no device structures are to be formed.

In one example, the alignment marks of a row in the pattern are spaced apart such that the intervals between them vary along the length of the substrate in a predetermined manner. In this example, an associated row can be positioned next to the first row, the intervals in the associated row varying in a related manner, such that the two rows can be observed together to provide positional information of constant resolution. In addition to providing positional information in a direction parallel to the rows, the two rows can be monitored to give information on a position of the substrate in a direction perpendicular to the rows.

In one example, the pattern can comprise one or more rows arranged to extend across a width of the substrate. These rows can comprise a plurality of linear alignment marks, each mark extending in a direction transverse to the row. In such cases, the row of alignment marks can have a substantially uniform pitch, and the detection system can comprise an array of lenses have a substantially uniform different pitch. In this example, the step of using the detection system to detect the alignment marks then comprises observing the row of alignment marks through the array of lenses.

In one example, the pattern of alignment marks comprises a plurality of rows of alignment marks, which can comprise parallel rows. Certain rows can pass through target areas, or alternatively the target areas can be arranged between rows.

In one example, the pattern of marks comprises at least two parallel rows, one along each side of the substrate. Four parallel rows can be employed, the method then comprising the steps of using the detection system to monitor all four rows, and using all four rows to determine a position of the substrate in a direction perpendicular to the rows.

This detection can be performed using an array of lenses having a pitch related to the separation of the rows.

In one example, the pattern of alignment marks is arranged to extend over at least 80% of the length and/or the width of the substrate.

As mentioned above, the pattern can comprise alignment marks arranged inside a target area or target areas of the substrate. Such marks are arranged at substrate locations on which no device layers are to be formed, although in certain embodiments alignment marks can be provided at locations of device layers.

In one example, the detection of the marks can be achieved using at least one camera, and/or at least one detector (e.g., a charge coupled device (CCD)) to detect radiation reflected from the substrate and through an array of lenses, e.g., distributed over an area of the substrate. This array of lenses can be common to the detection and projection systems, i.e., it can be a MLA used to project radiation spots onto the substrate.

In one example, the detection of the alignment marks can be used to control the movement system (e.g., to adjust a scan speed) and/or to adjust the timing and/or position of the patterns applied to the array(s) of controllable elements.

According to another embodiment of the present invention there is provided a lithographic apparatus comprising an illumination system, an array of individually controllable elements, a projection system, a movement system, and a detection system. The illumination system supplies a beam of radiation. The array of individually controllable elements imparts the beam with a pattern in its cross-section. The projection system projects the patterned beam onto a target portion of a substrate. The movement system causes relative movement between the substrate and the projection system. The detection system is arranged to detect individual, indiscrete alignment marks distributed in a pattern over an area of the substrate so as to determine a relative position of the substrate to the projection system.

In one example, the detection system can be arranged to detect rows of the alignment marks on the substrate, to detect rows of the alignment marks spaced apart along edge portions of the substrate and/or to detect rows of the alignment marks at a plurality of positions across the substrate.

In one example, the detection system can comprise at least one camera, and/or an array of lenses and at least one detector (e.g., a charge coupled device (CCD)) to detect radiation reflected from the substrate, through the array of lenses.

In one example, the projection system comprises a lens array arranged to focus the patterned beam onto the target surface of the substrate, and the detection system comprises at least one detector arranged to detect radiation reflected from the substrate, through the array of lenses.

In one example, the apparatus can further comprise a controller arranged to control the array of individually controllable elements. In this example, the detection system is arranged to provide a signal to the controller, the signal being indicative of a position of the substrate relative to the projection system. The controller is arranged to control the elements according to the signal from the detection system. Alternatively, or additionally, the detection system can be arranged to provide a signal to a controller arranged to control the movement system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
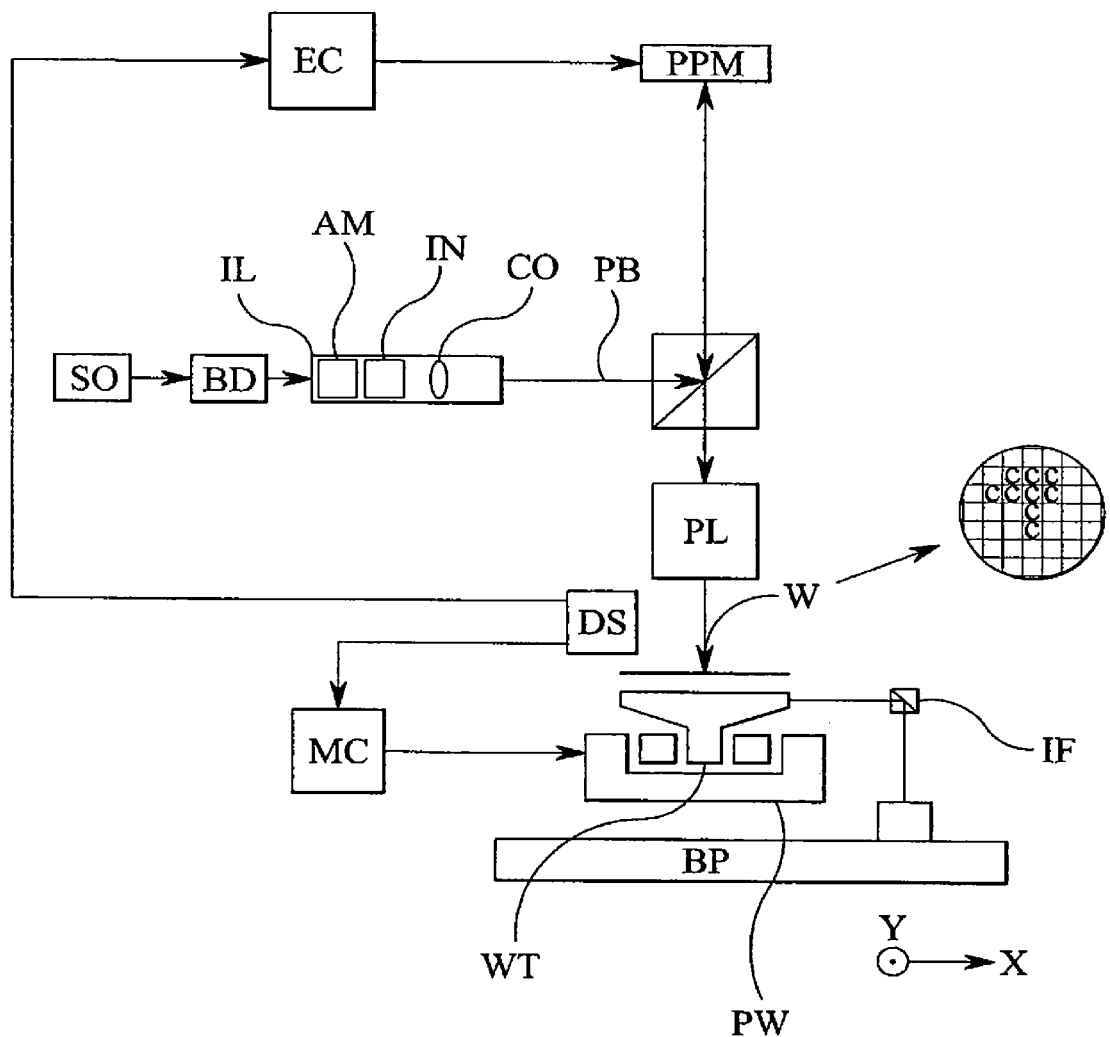
FIG. 1 depicts a lithographic apparatus, according to one embodiment of the present invention.

FIGS. 7, 8, and 9 depict a lithographic apparatus, according to various embodiments of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Throughout the remainder of this specification the terms "alignment mark" and "alignment marks" will be used to denote one or more individual, indiscrete alignment marks respectively, unless otherwise stated. By "individual" it is meant that each alignment mark is separate and distinct from others of its kind (i.e., from the other alignment marks). By "indiscrete" it is meant that each alignment mark is not divided into parts (e.g., each alignment mark is a single, undivided entity). A variety of such marks can be used in embodiments of the invention, and it will be appreciated that the dots, spots, and lines referred to in this specification are merely specific examples. Other forms can be used.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively.

The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used. For example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus, according to a one embodiment of the present invention. The apparatus comprises an illumination system (illuminator) IL, an array of individually controllable elements PPM, a substrate table (e.g., a wafer table) WT, and a projection system ("lens") PL. The illumination system IL provides a projection beam PB of radiation (e.g., UV radiation). The array of individually controllable elements PPM applies a pattern to the projection beam. In general, the position of the array of individually controllable elements will be fixed relative to item PL. However, it can instead be connected to a positioning means for accurately positioning it with respect to item PL. The substrate table WT supports a substrate (e.g., a resist-coated wafer) W, and connected to positioning means PW for accurately positioning the substrate with respect to item PL. The projection system PL images a pattern imparted to the projection beam PB by the array of individually controllable elements PPM onto a target portion C (e.g., comprising one or more dies) of the substrate W. The projection system can image the array of individually controllable elements onto the substrate. Alternatively, the projection system can image secondary sources for which the elements of the array of individually controllable elements act as shutters. The projection system can also comprise a micro lens array (known as an MLA), e.g., to form the secondary sources and to image microspots onto the substrate.

In one example, the apparatus is of a reflective type (i.e., has a reflective array of individually controllable elements). In another example, it can also be of a transmissive type, for example (i.e., with a transmissive array of individually controllable elements).

The illuminator IL receives a beam of radiation from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source can be integral part of the apparatus, for example when the source is a mercury lamp. The source SO and the illuminator IL, together with the beam delivery system BD if required, can be referred to as a radiation system.

The illuminator IL can comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning means PW (e.g., including interferometric measuring means IF), the substrate table WT can be moved accurately, e.g., so as to position different target portions C in the path of the beam PB.

In one example, a positioning means for the array of individually controllable elements can be used to accurately correct the position of the array of individually controllable elements PPM with respect to the path of the beam PB, e.g., during a scan.

Movement of the object table WT is realized with the aid of a long-stroke module (course positioning) and a short-stroke module (fine positioning), which are not explicitly depicted in FIG. 1. A similar system can also be used to position the array of individually controllable elements. It will be appreciated that the projection beam can alternatively/additionally be moveable while the object table and/or the array of individually controllable elements can have a fixed position to provide the required relative movement. As a further alternative, that can be especially applicable in the manufacture of flat panel displays, the position of the substrate table and the projection system can be fixed and the substrate can be arranged to be moved relative to the substrate table. For example, the substrate table can be provided with a system for scanning the substrate across it at a substantially constant velocity.

The positioning means PW is controlled by a movement system controller MC which receives a signal from a detection system arranged to detect individual alignment marks on the upper surface of the substrate W. That signal is indicative of the position of the substrate W relative to the projection system PL. A corresponding signal from the detection system is also provided to an element controller EC which controls the elements of the programmable patterning device PPM.

Although the lithography apparatus according to the invention is herein described as being for exposing a resist on a substrate, it will be appreciated that the invention is not limited to this use and the apparatus can be used to project a patterned projection beam for use in resistless lithography.

The depicted apparatus can be used in five modes:

1. Step mode: the array of individually controllable elements imparts an entire pattern to the projection beam, which is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements is movable in a given direction (the "scan direction", e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.

4. Continuous scan mode: essentially the same as pulse mode except that a substantially constant radiation source is used and the pattern on the array of individually controllable elements is updated as the projection beam scans across the substrate and exposes it.

Pixel Grid Imaging Mode: the pattern formed on a substrate is realized by subsequent exposure of spots formed by a spot generator that are directed onto an array of individually controllable elements. The exposed spots have substantially the same shape.

On the substrate the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
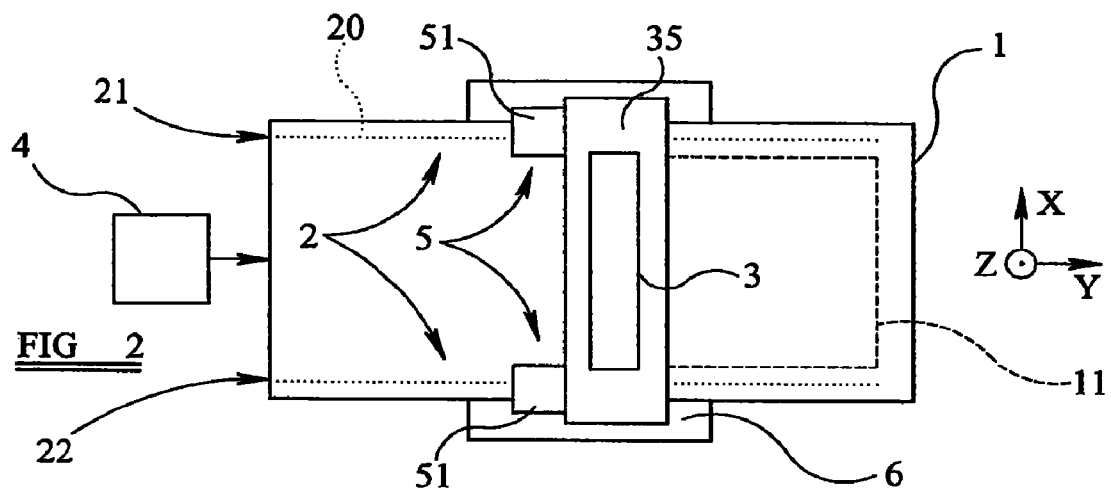
FIG. 2 depicts a lithographic apparatus, according to one embodiment of the present invention.
Figure 3:
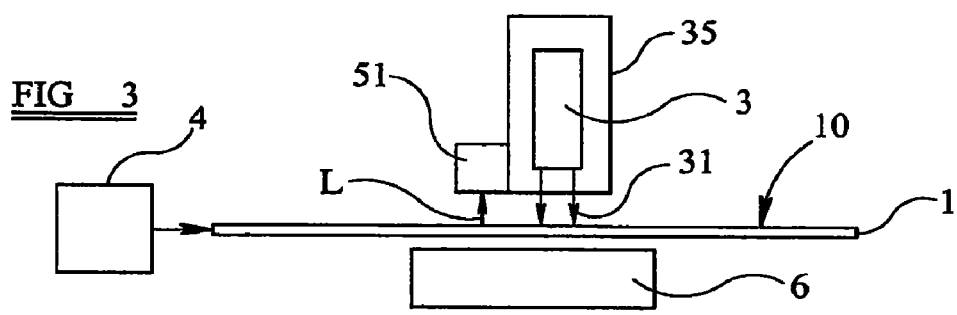
FIG. 3 is a side view of the apparatus of FIG. 2, according to one embodiment of the present invention.

FIG. 2 depicts a lithographic apparatus, according to one embodiment of the present invention. FIG. 3 is a side view of the apparatus of FIG. 2, according to one embodiment of the present invention. A central portion of a substrate 1 is supported by a stationary support table 6. This support table 6 is stationary in the sense that it does not move in either the X or Y directions relative to the frame 35. A movement system 4 is arranged to cause movement of the substrate 1 over the support table 6.

In one example, the movement system 4 can be arranged to provide movement of the substrate 1 in one direction only (eg scanning in the Y direction). In another example, the movement system 4 can be arranged so as to provide controllable movement of the substrate in more than one direction. For example, it can provide movement in the X and Y directions and can also be arranged to provide controllable rotation of the substrate, for example, about the Z axis.

An upper surface 10 of the substrate 1 is provided with a pattern 2 of individual, indiscrete alignment marks 20, the pattern being distributed over a wide area of the substrate. In this example, the indiscrete alignment marks are small spots or dots 20.

The pattern 2 comprises a first row 21 of alignment marks extending along one side of the substrate surface and a second row 22 extending along an opposite side of the substrate. The first and second rows 21, 22 are parallel to each other and are arranged outside and on either side of an area 11 of the substrate to be patterned (e.g., area 11 can also be referred to as the patterned area). A frame 35 is arranged above the portion of the substrate 1 supported by the table 6. The frame 35 supports a combined radiation beam patterning and projection system 3. The system 3 comprises at least one programmable (i.e., controllable) beam patterning device and a projection system for projecting the or each patterned beam on to the substrate. The combined system 3 thus delivers a patterned dose of radiation to an area of the substrate extending across its width.

In this embodiment, the apparatus also includes a detection system 5, which comprises cameras 51 (e.g., microscope cameras) attached to the frame 35 in front of and on either side of the area of the substrate being exposed to the patterned beam from the combined beam patterning and projection system 3. These microscope cameras 51 are each arranged to detect the individual alignment marks 20, and hence are arranged to monitor the rows of alignment marks on either side of the substrate. The microscope cameras 51 detect reflected light L from the substrate at a position in front of the target portion of the substrate being exposed to the patterned beam 31.

It will be appreciated that, by monitoring the two rows 21, 22 of alignment marks 20, the detection system is able to provide an indication of the movement of the substrate 1 in the Y direction. In one example, the detection system is arranged so that the two lines 21, 22 can also be monitored to provide an indication of any displacements of the substrate 1 in the perpendicular X direction. To ensure that the radiation pattern is projected on to the correct portion of the substrate (either in a first exposure step or in a subsequent exposure step to overlay a pattern on a previously produced pattern), a signal or signals from the detection system can be used to control/adjust a speed of movement of the substrate 1 in the Y direction (e.g., to provide coarse corrections) and/or can be used to control the patterning of the beam or beams in the combined beam patterning and projection system 3.

For example, if the detection system provides an indication that a shift in the X direction has occurred, a signal or signals from the detection system can be used to adjust the control signals to the controllable elements in the beam patterning and projection system, so as to provide a corresponding shift in the projected pattern.

Additionally, or alternatively, a signal or signals from the detection system can be used to adjust the timing of control data sent to the controllable elements, so that the radiation pattern being projected on to the substrate at a particular time is appropriate to the current position of the substrate in the Y direction.

It will be appreciated that the detection system can also be used to detect rotations of the substrate 1 in the Z direction, and the movement system can be controlled to correct for the rotation or alternatively the beam patterning can be adjusted to compensate for the rotation.

Figure 4:
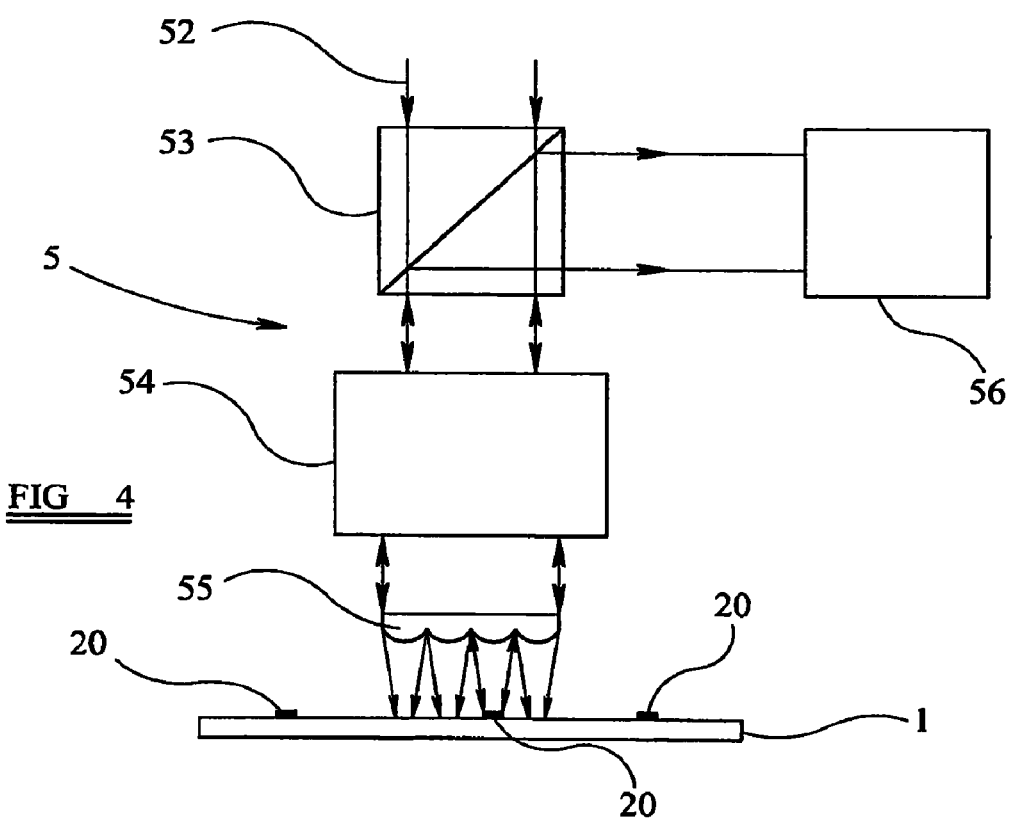
FIG. 4 depicts part of a detection system for use in a lithographic apparatus, according to one embodiment of the present invention.

FIG. 4 shows part of a detection system suitable for detecting individual, indiscrete alignment marks, according to one embodiment of the present invention. A part of a substrate 1 has an array of alignment marks 20 distributed on its upper surface.

The alignment marks are arranged so as to have different reflective characteristics from the substrate. In this embodiment, the detection system comprises a radiation source (not shown in the figure), which provides a beam of radiation 52. Using a beam splitter 53, this radiation is supplied to a projection system 54 that can, in certain examples, comprise a beam expander arrangement. The projection system 54 then supplies the beam to an array 55 of lenses. This can, in certain examples, be a lens array of the type commonly referred to as a micro lens array (MLA). The lens array 55 focuses the radiation beam on to the substrate surface as a plurality of radiation spots. In this example, the alignment marks 20 are arranged so as to have a size, which generally corresponds with the size of the projected radiation spots. Reflected light from the substrate and any alignment mark or marks under the lens array 55 is directed back through the projection system 54 and via the beam splitter 53 to a detection device 56, which can be a CCD array having a structure such that individual alignment marks 20 on the substrate can be detected. The detection device 56 provides an output signal for use in control of the substrate movement system and/or for use in control of the elements of the programmable device used to pattern the beam for exposing an area of the substrate.

In one example, the beam splitter 53, the projection system 54, and the lens array 55 can be components common to the beam patterning and projection system for supplying the pattern radiation dose to the substrate. Alternatively, they can be separate from the beam patterning and projection system.

It will be appreciated that, although the lens array in FIG. 4 is shown as having only four lens components, this is a simplification to facilitate the illustration. In one example, the lens array or MLA can be an array of thousands of individual lenses.

Figure 5:
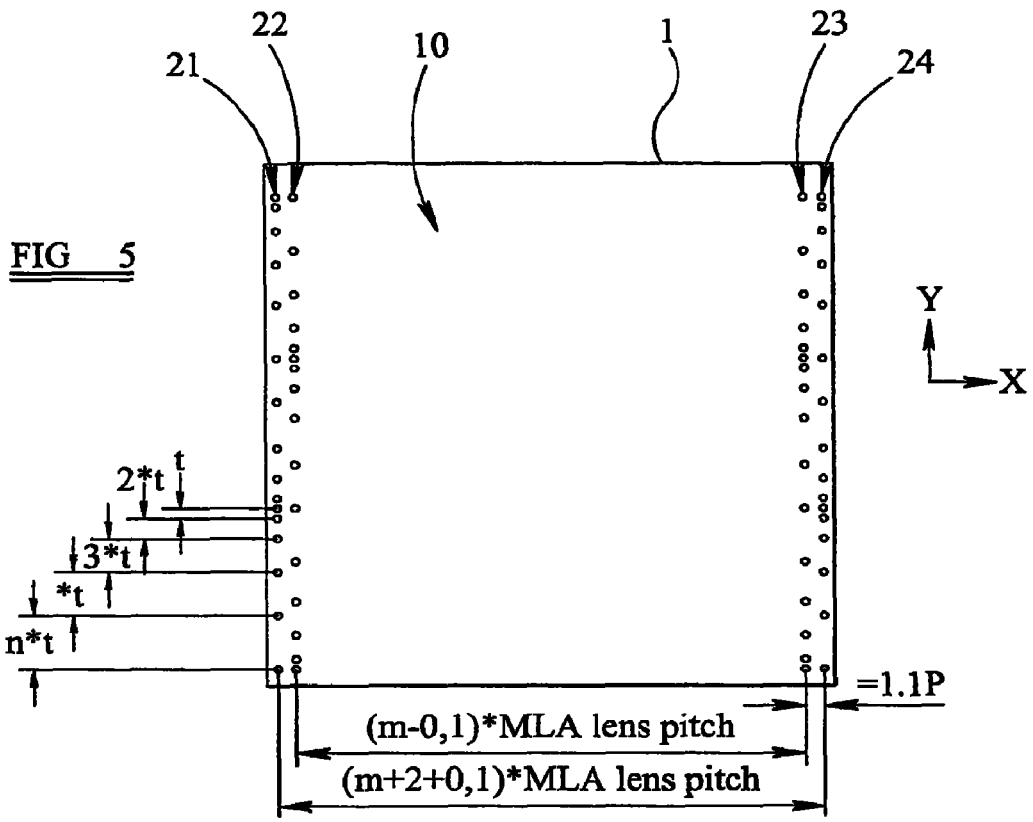
FIG. 5 depicts a substrate patterned with alignment marks, according to one embodiment of the present invention.

FIG. 5 shows a view of the upper surface of a substrate 1 to which a pattern of dedicated alignment features has been applied, according to one embodiment of the present invention. In one example, the individual alignment marks of the pattern are generally circular. They can also be referred to as spots or dots. The alignment marks are arranged in four rows 21, 22, 23 and 24, each row extending along a substantial portion of the substrates length (in the Y direction). In this example, each row covers approximately 90% of the substrates length. All the rows are shown as having the same number of alignment marks (16 in the simplified representation).

It will be appreciated that in other examples, the number of alignment marks in the different rows can themselves be different. Also, each row can comprise many more alignment marks than are shown in the figure. The number of alignment marks can be in excess of 100, 1000, or even higher for very large substrates. For example, the alignment marks can be arranged with an average distance of around 10 mm between them, giving a density of approximately 10000 marks (e.g., dots) per square meter. Deformation of the substrate, such as deformation in between two exposures, together with the required overlay, can of course reduce or increase this density.

In this embodiment, the four rows of alignment marks are parallel to each other. Two of the rows 21, 22 are arranged on one side of the substrate (adjacent a first edge) and the other two rows 23, 24 are arranged on an opposite side of the substrate (adjacent a second edge). In FIG. 2, the alignment marks 20 of the two rows were arranged at substantially regular intervals along the substrate. In contrast, in each row in FIG. 5, the intervals between adjacent marks are arranged to vary in a predetermined manner along the substrate. Thus, when the substrate is exposed in a lithographic method, a measurement of the interval between adjacent spots is able to provide information on the position of the substrate in the Y direction with respect to the projection apparatus.

Looking at the first row 21, and starting with the alignment mark shown at the bottom left-hand corner of the substrate in figure, as one moves along the substrate in the Y direction, the intervals between marks become progressively smaller over a first portion of the length, then become progressively larger over a second portion of the length, then again become progressively smaller over a third and final portion of the length. For illustrative purposes, the interval between the fifth and sixth marks of the first row 21 is denoted by the letter T, the interval between the fourth and fifth marks is 2T, the interval between the third and fourth marks is 3T, the interval between the second and third marks is 4T, and the interval between the first and second marks is 5T. This same general pattern of interval variation along the length of the row can be used in rows comprising a much larger number of alignment marks.

Although the varying intervals enable a measurement of the marks to give more positional information, it will be appreciated that the measurement resolution in the Y direction will also vary along the length of the row, if only one row is observed. To compensate for this, the second row 22, next to the first row 21, is an associated row in which the intervals between adjacent marks vary in a different but related predetermined manner.

In the example shown in FIG. 5, in the second row, the intervals between marks are progressively increasing while those for the first row are progressively decreasing, and vice versa. The pattern of interval variation in the second, associated row, can be though of as being the same as that in the first row, but 180 degrees out of phase. When the substrate is patterned, it is desirable to have a detection system that is able to monitor the first and second rows 21, 22 simultaneously, to provide further information on the Y position of the substrate. The resolution of that measurement is substantially constant along the length of the substrate. Similarly, the third and fourth rows 23, 24 are associated. The pattern of interval variation along the third row 23 is out of phase with that in the fourth row 24.

Although a number of different detection systems can be used to observe the pattern of alignment marks shown in FIG. 5, the pattern is particularly intended for use with a detection system incorporating a micro lens array (MLA) of uniform lens pitch P.

The spacing between the second and third rows 21, 23 in this example, is about (m−0.1) P, where m is an integer. The spacing between the first and fourth rows 21, 24 is about (m+2+0.1) P, and the separation between the first and second rows 21, 22 and the third and fourth rows 23, 24 is about 1.1 P.

In one example, the detection system is arranged to monitor all four lines (i.e., the two pairs of lines at maximum +X and −X positions) along the Y direction, the pitch of the lines (X) slightly differing from the lens array pitch (P) in X. The substrate is aligned in a proper way if the reflected intensities from the four lines, as viewed through the MLA, are equal. If they are not the same, then there is a remaining shift in X, or an expansion of the substrate has occurred in the X direction (for example, as a result of thermal expansion). Thus, by using an appropriately arranged detection system to monitor all four lines as the substrate is moved in the Y direction, an indication can be given of both the Y position and X position of the substrate.

It will be appreciated that the 0.1 offset described above is only an example, and other offsets can, of course, be used in alternative embodiments.

In one example, the pattern of dots in FIG. 5 can be monitored either by a microscope camera just in front (and at the end) of a lens array or by lens array elements and a detector arranged to observe the reflected light from the substrate. The speed at which the substrate moves, rotates and expands in Y (with respect to the lens array) can be monitored and continuously adjusted in the exposure pattern of the programmable beam patterning device (e.g., a digital mirror device (DMD)). This can be achieved by monitoring the pattern of intensity pulses from the alignment dots. The use of associated lines enables compensation to be made for varying Y resolution as a function of the varying alignment mark pitch in each row, by having one line with pitch increasing and one with pitch decreasing parallel and next to each other.

Figure 6:
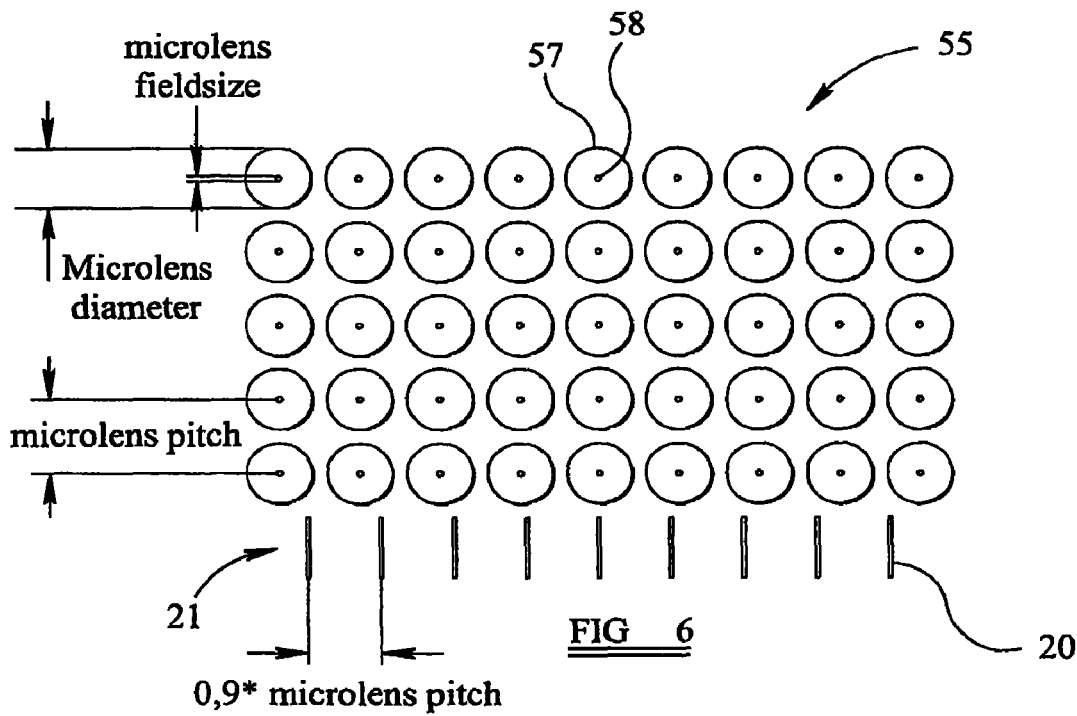
FIG. 6 depicts detection of an array of alignment marks, according to one embodiment of the present invention.

FIG. 6 illustrates a technique to align a substrate in a nominal X direction, according to one embodiment of the present invention. This technique can be used to position the substrate at the start and end of the substrate, or indeed at some position in its middle. The method comprises providing a row 21 of alignment marks 20, extending across a width of the substrate. Each alignment mark is linear, and these line marks are parallel to each other, each one extending along the substrate (i.e., in the nominal Y direction). The intervals between the marks in the row 21 are all the same. The row of marks is then observed through an array of lenses (e.g., a MLA) having a pitch P. The pitch of the alignment marks in the row 21 is arranged so as to be slightly different from the pitch of the lens array (e.g., it can be about 0.9 P). In this example, the width of each linear alignment mark 20 corresponds to the micro lens field size 58 of each lens 57.

When the row 21 of marks 20 is observed through the lens array, there is a vernier effect as a result of the differing pitches of the row 21 and lens array and hence the location of the lens through which a maximum intensity is observed is indicative of the positioning of the row of marks in the X direction. In one example, the row 21 of marks is positioned on a substrate such that the substrate is correctly aligned with respect to a beam of projection system when a maximum reflected intensity is observed at a central position.

FIG. 7 illustrates a lithographic apparatus and device manufacturing method, according to one embodiment of the present invention. A substrate 1 has been provided with a pattern of individual, indiscrete alignment marks, that pattern including a plurality of parallel rows of alignment spots 21, 22, 23, 24 extending along the substrate, and a plurality of parallel rows of linear alignment marks 25, 26, 27, 28 extending across the width of the substrate. A detection system 5 is attached to a frame 35 and is able to detect individual alignment marks, of both types, across the entire width of the substrate.

Connected to the frame 35 is a combined beam patterning and projection system 3, extending across a portion of the substrate width. By appropriate movement of the substrate 1 and appropriate control of the controllable elements in the beam patterning device or devices of the beam patterning and projection system 3, target areas 11 and 12 of the substrate surface are patterned (i.e., desired radiation dose patterns have been delivered to them). Information from the detection system 5 is used to ensure that these radiation patterns have been correctly located with respect to the substrate and to any previously written features. Some of the alignment marks (in particular some of the spots from the parallel rows 22 and 23) are located inside the target areas 11, 12, while others are outside the patterned areas.

FIG. 8 shows part of a lithographic apparatus, according to one embodiment of the present invention. A long substrate 1 (only a longitudinal part of which is shown) has been provided with a pattern of individual alignment spots, that pattern comprising three rows 21, 22, 23. The first and third rows 21, 23 are located along edge portions of the substrate, whilst the second row 22 runs generally along a central portion of the substrate.

The substrate is arranged to be moved past a frame 35, which carries an array of beam patterning and projection arrangements. The array extends across a portion of the substrate width. Each arrangement 36 comprises a respective beam patterning device comprising an array of controllable elements and a projection system for projecting the patterned beam on to the substrate. A detection system is arranged to monitor the rows of alignment spots. This detection system comprises fixed detectors 51, at fixed positions relative to the frame 35 for monitoring the outer rows of alignment marks, and a moveable detector 57 (moveable in the nominal X direction) for monitoring the middle row 22.

FIG. 9 shows a beam patterning and projection system located within a frame 35, according to one embodiment of the present invention. The beam patterning and projection system comprises an array of optical "engines" 36, each of which comprises a respective array of controllable elements for patterning the beam, and a respective beam projection system including a respective micro lens array. A substrate 1 has been provided with a pattern of alignment marks, that pattern comprising a plurality of rows 21-26. There is at least one row for each optical engine 36. In this example, rather than having a separate detection system, the rows of alignment marks are detected and monitored via the same micro lens arrays that are used to project the patterned beams on to the substrate to build up an exposure pattern over the target area 11.

It will be appreciated that in certain embodiments of the invention, alignment of a substrate in a scan direction (say Y), can be achieved by provided the substrate with varying periodic on-off dots along the Y direction, positioned at the extremities of the substrate in the X direction. These lines of dots can be monitored by suitable means, such as microscope cameras, or via MLA's for example. Alignment of a substrate perpendicular to a scan direction at the beginning and end of the substrate, can be achieved by providing the pattern of alignment marks which comprises a set of lines (e.g., about 1 mm in length), separated in the X direction at a pitch which differs slightly from the pitch of a lens array used to monitor the marks. The intensity of the reflected light from the alignment lines, as viewed through the lens array, can give an accurate indication of the position of the substrate with respect to the lens array. Embodiments of the invention enable accurate alignment of substrates to be achieved, for many different types of substrates (e.g., round, square, rectangular, etc.). The patterns of individual, indiscrete alignment marks can be used in conjunction with other types of alignment marks (for example, those incorporating diffraction gratings).

In one or more embodiments and/or examples, no pre-alignment scan is required before the substrate can be patterned. A substrate can immediately be put in a proper position to start exposure by appropriate detection of the pattern of individual alignment marks.

In one or more embodiments and/or examples, only a small surface area at the edge of the substrate can be required (for location of the pattern of alignment marks).

In one or more embodiments and/or examples, individual alignment marks can be employed inside target areas (e.g., in the middle of LCD device structures) because the marks are so small. They can not be visible in the eventual completed device. This is particularly useful in the production of large flat panel display screens. Positioning at least some of the individual, indiscrete alignment marks inside the panel active area, enables the overlay of patterns during the device production to be more accurately controlled than in the prior art arrangements.

In one or more embodiments and/or examples, overlay can be controlled by measuring marks on regular locations on the substrate. One or more rows can be used. Coarse corrections can be corrected by adjusting the scan speed of the substrate. Fine corrections (in X, in Y, rotations in Z, magnification errors etc) can be made by either moving the imagining array or changing the image on the array (i.e., adjusting the data controlling the controllable elements which pattern the beam).

Although the alignment marks have been arrange in rows, it will be appreciated that other patterns of alignment marks can be employed. All that is required is that the locations at which the marks are formed are known. For example, the alignment marks are located at positions on the substrate that will not be covered by device layers in the eventual, completed device. In other words, the alignment marks are positioned at locations coinciding with "flat areas" of the eventual device. Thus, rather than simply arranging a row of alignment spots at regular intervals along the substrate, the spacing between the marks can be adjusted to as to have no, or minimal, interference with the device lines or tracks. In other words, the locations at least some of the alignment marks can be inside a target area, but selected so as to avoid areas on which device structures are to be built.

Another technique of avoiding interference with device features, would be to adjust the size or orientation of the alignment feature, or only to treat data within a limited time window as we observe alignment marks as the substrate moves along, that time window being selected as one in which we are sure there is no device information coming.

In one example, a second or further set of alignment marks (e.g., spots) is positioned in new flat areas of the device in cases where it was not possible to provide optimum locations for all of the alignment marks for the whole processing of the substrate from the onset.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. A lithographic apparatus, comprising:
an array of individually controllable elements configured to provide a patterned beam of radiation;
a projection system configured to project the patterned beam onto a target portion of a substrate;
a movement system configured to cause relative movement between the substrate and the projection system; and
a detection system configured to determine a position of the substrate relative to the projection system based on a distance between first and second adjacent indiscrete alignment marks located on a surface of the substrate.

2. The apparatus of claim 1, wherein the detection system is configured to detect rows of alignment marks on the substrate.

3. The apparatus of claim 1, wherein the detection system is configured to detect rows of alignment marks spaced apart along edge portions of the substrate.

4. The apparatus of claim 1, wherein the detection system is configured to detect rows of alignment marks at a plurality of positions across the substrate.

5. The apparatus of claim 1, wherein the detection system comprises at least one camera.

6. The apparatus of claim 1, wherein the detection system comprises:
an array of lenses; and
at least one detector configured to detect radiation reflected from the substrate through the array of lenses.

7. The apparatus of claim 1, wherein:
the projection system comprises a lens array configured to focus the patterned beam onto the target surface of the substrate; and
the detection system comprises at least one detector configured to detect radiation reflected from the substrate through the array of lenses.

8. The apparatus of claim 1, further comprising:

a controller configured to control the array of individually controllable elements, wherein the detection system is configured to provide a signal to the controller, the signal being indicative of a position of the substrate relative to the projection system, the controller being configured to control the elements according to the signal from the detection system.

9. The apparatus of claim 1, further comprising:

a controller configured arranged to control the movement system, wherein the detection system is configured to provide a signal to the controller, the signal being indicative of a position of the substrate relative to the projection system, the controller being configured to control the movement system according to the signal from the detection system.

10. The apparatus of claim 1, further comprising:

an illumination system configured to supply a radiation beam, wherein the array of individually controllable elements is configured to pattern the radiation beam to provide the patterned radiation beam.

* * * * *

UNITED STATES PATENT AND TRADEMARK OFFICE
CERTIFICATE OF CORRECTION

| | | |
|---|---|---|
| PATENT NO. | : 8,169,593 B2 | Page 1 of 1 |
| APPLICATION NO. | : 12/261663 | |
| DATED | : May 1, 2012 | |
| INVENTOR(S) | : Bijnen et al. | |

It is certified that error appears in the above-identified patent and that said Letters Patent is hereby corrected as shown below:

Title page, (75) Inventor section, please delete "Franciscus" and replace with "Fransiscus"

Signed and Sealed this
Tenth Day of July, 2012

David J. Kappos
*Director of the United States Patent and Trademark Office*